(12) United States Patent
McIntyre et al.

(10) Patent No.: US 10,971,036 B2
(45) Date of Patent: Apr. 6, 2021

(54) MEDICAL SIMULATION SYSTEM AND METHOD

(71) Applicant: Mentice-AB, Gothenburg (SE)

(72) Inventors: Jared McIntyre, Greenwood Village, CO (US); Les Brokke, Greenwood Village, CO (US); Chris Orth, Greenwood Village, CO (US); Richard Troy Taylor, Dacono, CO (US)

(73) Assignee: Mentice-AB, Gothenburg (SE)

( * ) Notice: Subject to any disclaimer, the term of this patent is extended or adjusted under 35 U.S.C. 154(b) by 375 days.

(21) Appl. No.: 16/017,688

(22) Filed: Jun. 25, 2018

(65) Prior Publication Data

US 2018/0374389 A1     Dec. 27, 2018

Related U.S. Application Data

(60) Provisional application No. 62/525,609, filed on Jun. 27, 2017.

(51) Int. Cl.
*G09B 23/28*     (2006.01)
*G06F 30/20*     (2020.01)
*G09B 9/00*     (2006.01)

(52) U.S. Cl.
CPC .......... *G09B 23/285* (2013.01); *G06F 30/20* (2020.01); *G09B 9/00* (2013.01)

(58) Field of Classification Search
CPC .......... G06F 30/20; G09B 23/285; G09B 9/00
See application file for complete search history.

(56) References Cited

U.S. PATENT DOCUMENTS

| | | | | |
|---|---|---|---|---|
| 6,033,412 | A * | 3/2000 | Losken ............... | A61B 17/663 606/105 |
| 6,837,883 | B2 * | 1/2005 | Moll ................... | G09B 23/285 606/1 |
| 7,113,166 | B1 * | 9/2006 | Rosenberg ........... | G09B 9/00 345/156 |
| 9,480,534 | B2 * | 11/2016 | Bowling .............. | A61B 34/20 |

* cited by examiner

*Primary Examiner* — Eddy Saint-Vil
(74) *Attorney, Agent, or Firm* — Adsero IP

(57) ABSTRACT

Novel tools and techniques are provided for implementing medical simulation, and, in particular, for implementing medical simulation to simulate a medical instrument entering and maneuvering in a body of a person. A medical simulation system comprising a medical instrument detection unit, a medical instrument tracker unit, a braking unit may be provided. The medical simulation detection unit may determine when a medical instrument is interacting with the system. The tracking unit may track the movement and position of the medical instrument. The braking unit may be used to engage the medical instrument and simulate haptic effects. A medical simulation containment system for the medical simulation system may also be provided.

4 Claims, 12 Drawing Sheets

Section A-A

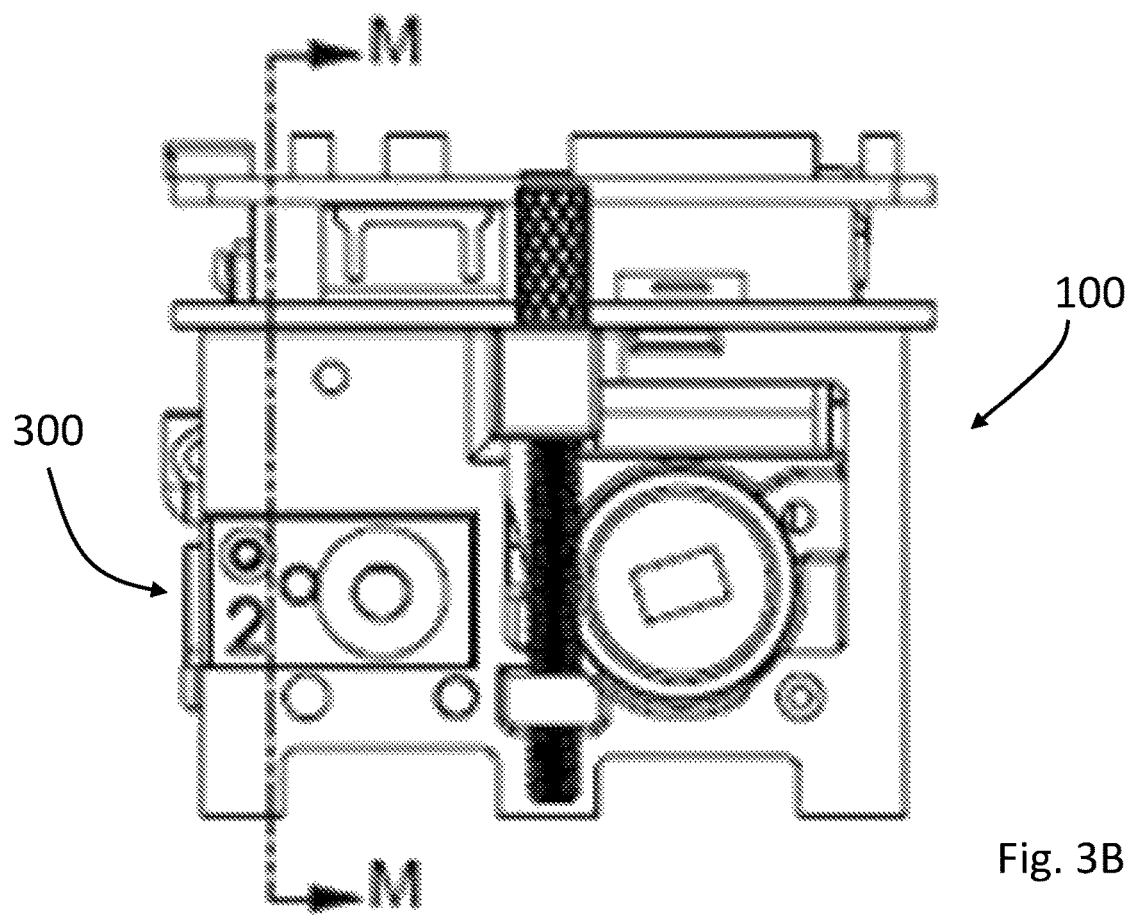
Fig. 3B
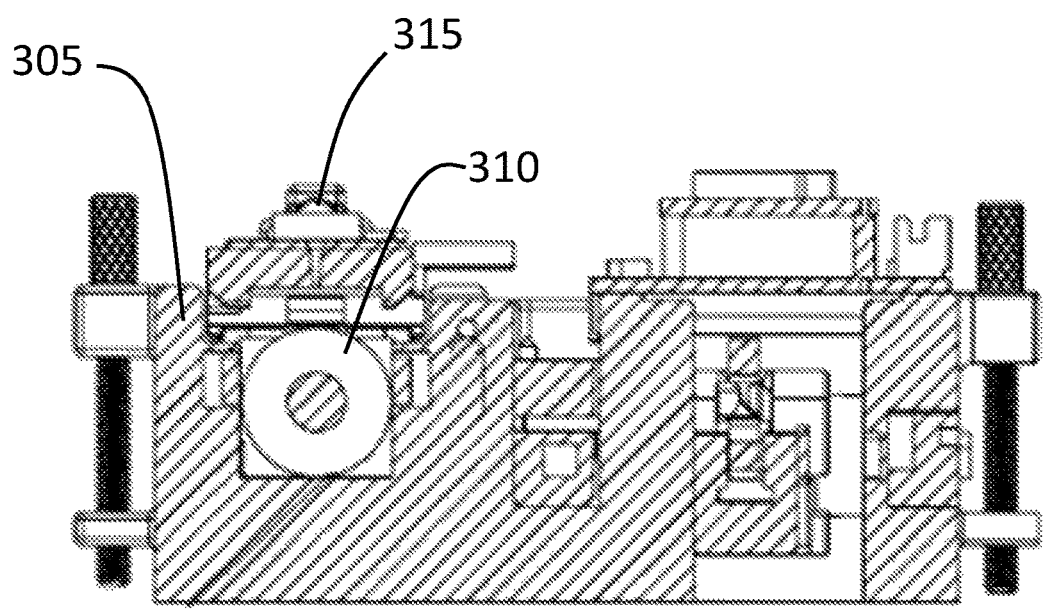
Section M-M  Fig. 3C

Section A-A

MEDICAL SIMULATION SYSTEM AND METHOD

CROSS REFERENCE TO RELATED APPLICATION

This application claims priority to U.S. Provisional Application No. 62/525,609, filed on Jun. 27, 2017, by Jared McIntyre et al., and entitled, "MEDICAL SIMULATION SYSTEM AND METHOD". The entire disclosure of this application is incorporated herein by reference in its entirety for all purposes.

FIELD OF THE INVENTION

The present disclosure relates, in general, to methods, systems, apparatus, and computer software for implementing medical simulation, and, in particular, embodiments, directed to methods, systems, apparatus, and computer software for implementing medical simulation to simulate a medical instrument entering and maneuvering in a patient.

BACKGROUND OF THE INVENTION

Healthcare education leaders have seen the need for medical simulation systems that efficiently train, evaluate, and enhance individual medical practitioner's skills to improve patient outcomes. Medical simulation systems are also needed to help doctors, nurses, hospital administrators, and/or the like determine a type of medical instrument to use in a specific medical situation. Testing and training using medical instruments on live patients can be costly, time consuming, and cause difficulty comparing the performance of different instruments.

Many known medical simulation devices designed to simulate the experience of a medical instrument entering into and being manipulated within a patient are large and relatively difficult to transport. Doctors and students who wish to use relatively large medical simulation units may be required to travel to the location of the medical simulation unit or the medical simulation unit would have to be disassembled and reassembled at each location. Further, if a relatively large medical simulation unit is shipped, there was a significant risk that the medical simulation unit would be damaged during shipping.

Hence, there is a need for more robust and scalable solutions for implementing medical simulations.

SUMMARY

Various embodiments provide improved techniques for implementing medical simulation, and, in particular, embodiments provide improved techniques for implementing medical simulation to simulate a medical instrument entering and maneuvering in a body of a person.

One embodiment may provide a medical simulation system comprising a detection system/unit for detecting a medical instrument. The medical instrument detection unit may determine when a medical instrument is interacting with the medical simulation system. The medical instrument detection unit may comprise a chamber having a first end and a second end, a light detector diode adjustably coupled to the first end of the chamber and configured to detect an amount of light transmitted through the chamber, and a light emitting diode adjustably coupled to the second end of the chamber and configured to transmit light through the chamber toward the light detector diode. The light detector diode may be configured to be adjusted independently of the light emitting diode.

The chamber of the detection system may further comprise a first opening in a bottom surface of the chamber. The first opening may allow debris from the medical instrument to fall out of the chamber.

Additionally and/or alternatively, the chamber may further have a second opening between the first end of the chamber and the second end of the chamber. The second opening may be configured to receive the medical instrument and pass the medical instrument through the chamber of the detection unit. The second opening may allow the medical instrument to pass through the chamber transverse to a path of light transmitted from the light emitting diode toward the light detector diode.

The medical instrument that interacts with the medical simulation unit and instrument detection system may be a catheter or any other medical instrument such as an endoscope, syringe, tube, etc. The detection unit may determine a change in the amount of light detected by the light detector diode when the catheter passes through the second opening of the chamber. Based on the change in light, the light detector diode may determine that a medical instrument is interacting with the medical simulation system and detection system. The detection unit may further determine a size of the catheter based on the determined change in the amount of light detected by the light detector diode. The detection system may also determine a type of catheter based on the determined size of the catheter.

The light detector diode of the instrument detection unit may be adjustably coupled to the first end of the chamber by a first screw and the light emitting diode of the instrument detection unit may be adjustably coupled to the second end of the chamber by a second screw. By coupling the light detector diode to the first screw, the light detector diode may be adjusted independently of the light emitting diode so that light is effectively received through the chamber. Further, by coupling the light emitting diode to the second screw, the light emitting diode may be adjusted independently of the light detector diode so that light is effectively transmitted through the chamber.

The chamber may be adjustable relative to the light detector diode and the light emitting diode. The chamber may comprise a first screw attached to the chamber near the first end of the chamber and a second screw attached to the chamber near the second end of the chamber. The first screw and the second screw may allow the first end of the chamber to be adjusted independently of the second end of the chamber. By having an adjustable chamber, the chamber may be adjusted so that light is effectively received and transmitted through the chamber.

The light detector diode and the light emitting diode or the first end of the chamber and the second end of the chamber may be adjusted independently to ensure that the light detector diode is aligned on a same plane as the light emitting diode. The light detector diode and the light emitting diode may be aligned along a horizontal plane.

Another embodiment of the medical simulation system may comprise a tracker unit/system for tracking movement of a medical instrument. The tracker unit may be used to determine a position, an orientation, or a movement (translation/rotation) of a medical instrument interacting with the medical simulation system and tracker system. The tracker unit may comprise a housing. The tracker system may further comprise a ball contained within the housing, configured to rotate within the housing, and configured to engage with the medical instrument. Additionally, the tracker unit may comprise a door coupled to the housing. The ball contained within the housing may be inserted into or removed from the housing when the door is in an open position.

The medical instrument interacting with the medical simulation system and/or tracker unit may be at least one of a catheter or any other medical instrument such as an endoscope, syringe, tube, etc. The tracker ball may be configured to move/rotate when the catheter contacts the tracker ball. The tracker unit may then determine a position, orientation, and/or movement of the catheter based on the movement/rotation of the tracker ball.

The ball may be secured in the housing of the tracker system when the door coupled to the housing is in a closed position. The door may be held in a closed position by at least one of friction, a clamp, or a snap. A bottom edge of the door may coupled to the housing (via a hinge) and the door may pivot about the bottom edge while the door is being moved toward the open position.

Additionally and/or alternatively, an embodiment of the medical simulation system may comprise a braking unit/system for applying friction to a medical instrument. The braking unit may be used to simulate haptic effects. The braking unit may comprise an electrical drive unit, a drive gear arranged for cooperation with the electrical drive unit, and a curved braking arm having a first end and a second end which is opposite to the first end. The first end of the braking arm may be arranged for cooperation with the drive gear and a fulcrum of the braking arm may be located on the second end of the braking arm opposite to the first end of the braking arm and drive wheel. The braking unit may further comprise a brake pad attached to the braking arm, which engages the medical instrument as the medical instrument interacts with the brake unit and the medical simulation system.

The medical instrument interacting with the medical simulation system and/or tracker unit may be at least one of a catheter or any other medical instrument such as an endoscope, syringe, tube, etc. When the brake pad engages the catheter, friction is applied to the catheter simulating at least one of the insertion of the catheter into a vein, a slip of the catheter in the vein, a stop of the catheter in the vein, and/or the like.

The braking unit may further comprise a bar removably coupled to the second end of the braking arm to prevent the braking arm from travelling backwards.

An additional embodiment is a medical simulation containment system. The medical simulation containment system may comprise a housing having a first chamber, a display device hingedly connected to the first chamber of the housing, and at least one, but preferably two covers hingedly connected to the first chamber of the housing.

The at least two covers may fold over the display device to maintain the display device within the first chamber when the display device is in a folded down position. The at least two covers may also lie flat when the at least two covers are folded over the display device. Additionally and/or alternatively, the display device may be prevented from rotating or moving when the at least two covers are folded over the display device.

The hinged connection of the display device to the housing may hold the display device upright and prevent the display device from moving towards a folded down position when the display device is in an upright position. The hinged connection of the display device may further allow the display device to rotate 180 degrees when the display device is in an upright position.

The housing of the medical simulation containment system may further comprise a second chamber positioned below the first chamber. A bottom surface of the first chamber may be a top surface of the second chamber. The bottom surface of the first chamber may open to provide access to the second chamber. The second chamber of the simulation containment system may contain a medical simulation system comprising a detection unit, a braking unit, and a tracker unit. The second chamber of the medical simulation may be accessible when the display device is in an upright position.

An additional embodiment may be a method of using a medical simulation system. The method may comprise providing a medical simulation unit comprising a processor, a medical instrument detection unit, a medical instrument tracker unit, and a braking unit and inserting a medical instrument into an opening of the medical simulation system.

The method may further comprise detecting, with the detection unit, whether a medical instrument is interacting with the medical simulation system, determining, with the detection unit, at least one of a size or a type of medical instrument interacting with the medical instrument detection system, and determining, with the medical instrument tracker unit, at least one of translational or rotational movement of the medical instrument with the medical simulation system.

Additionally and/or alternatively, the method may comprise, based on at least one of the detection of a medical instrument, the determination of the size or the type of medical instrument, or the determination of the translational or rotational movement of the medical instrument, determining, with a processor of the medical simulation system, haptic effects to simulate on the medical instrument. Based on the determined haptic effects, the method may further comprise determining, with the processor, a specified amount of force the braking unit should apply to the medical instrument to simulate the haptic effects. The method may then comprise applying, with the braking unit, the specified amount of force to the medical instrument.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

FIG. 3B is a side elevation view of the medical instrument tracker system of FIG. 3A.

FIG. 3C is cross sectional view of the medical instrument tracker system of FIG. 3A taken along line M-M of FIG. 3B.

DETAILED DESCRIPTION OF THE INVENTION

In the following description, for the purposes of explanation, numerous specific details are set forth in order to provide a thorough understanding of the described embodiments. It will be apparent to one skilled in the art, however, that other embodiments of the present invention may be practiced without some of these specific details. In other instances, certain structures and devices are shown in block diagram form. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers used herein to express quantities, dimensions, and so forth used should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
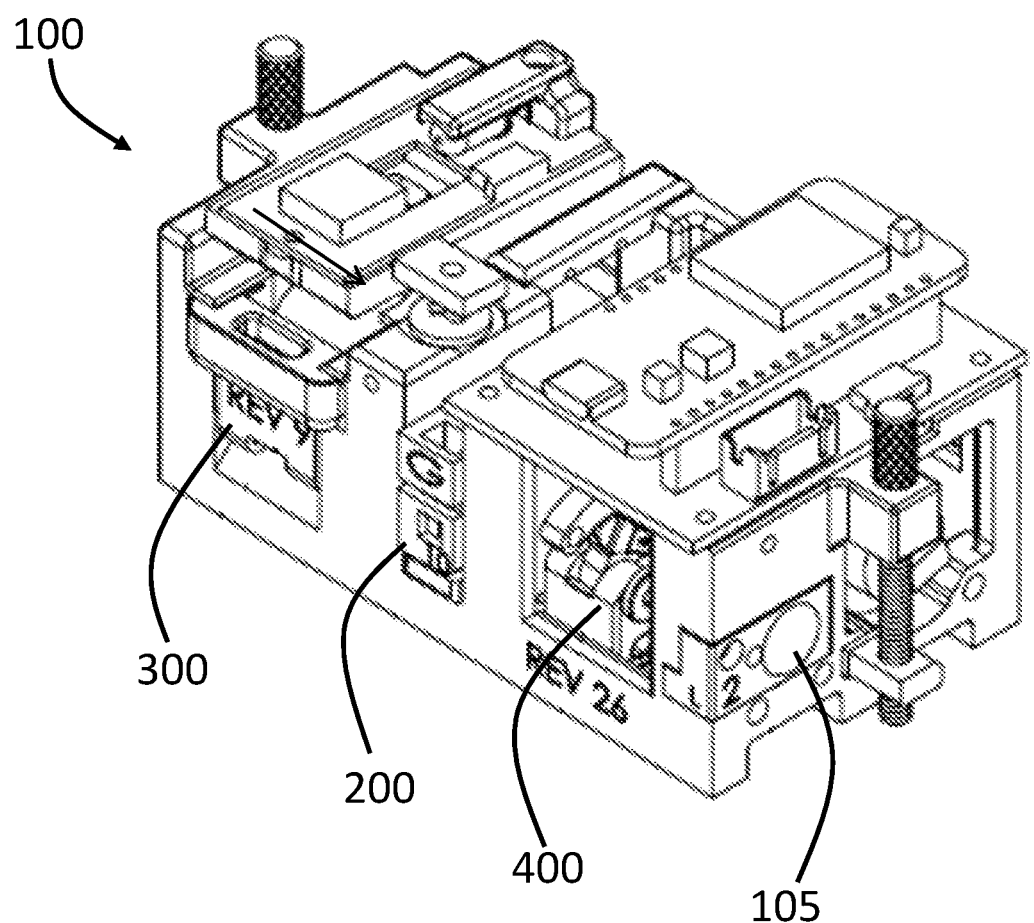
FIG. 1 is a perspective view of an embodiment of a medical simulation system, as disclosed herein.
Figure 2A:
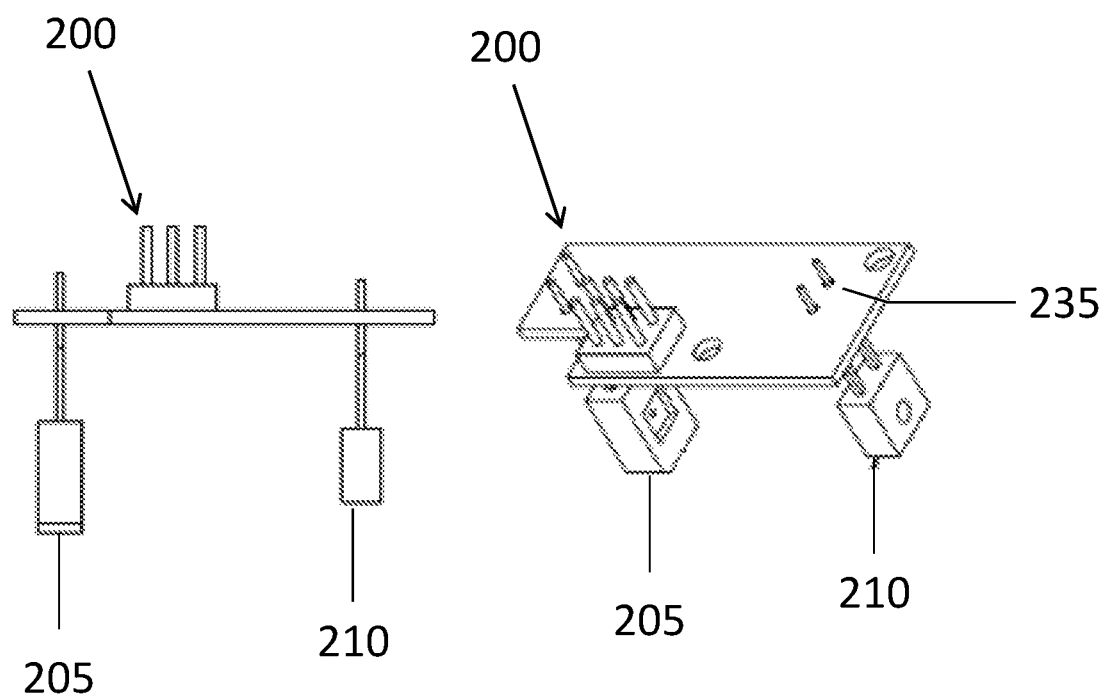
FIG. 2A is a front plan view and a perspective view of selected components of an optical medical instrument detector system, in accordance with various embodiments disclosed herein.
Figure 2B:
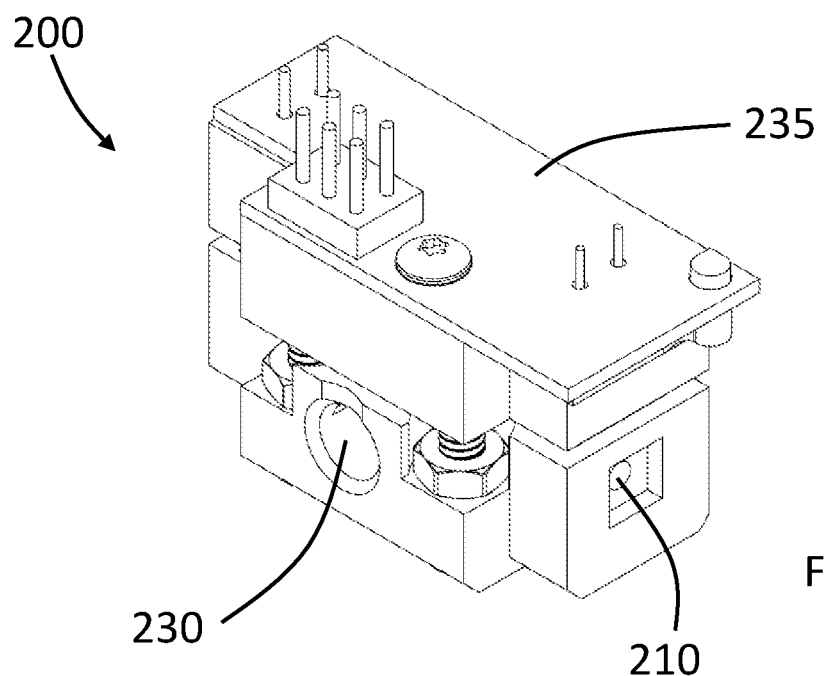
FIG. 2B is a perspective views a medical instrument detector system, in accordance with various embodiments.
Figure 2C:
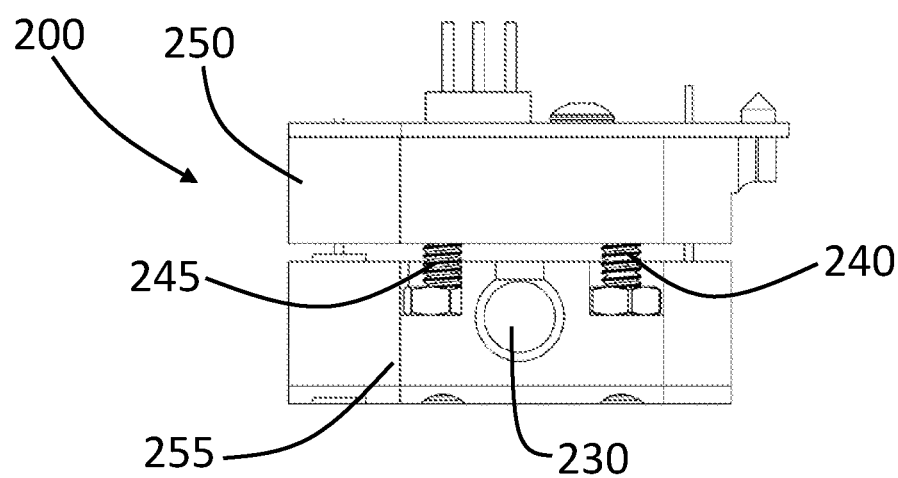
FIG. 2C is a front elevation view of the medical instrument detector system of FIG. 2B.
Figure 2D:
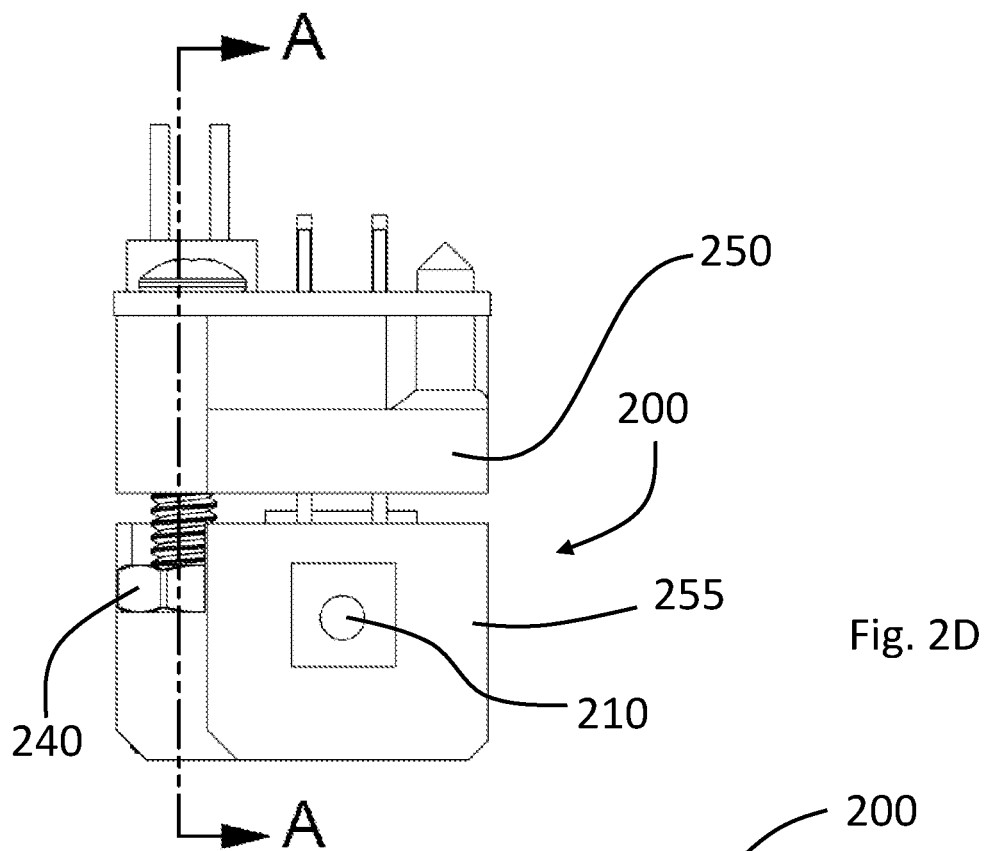
FIG. 2D is a side elevation view of the medical instrument detector system of FIG. 2B.
Figure 2E:
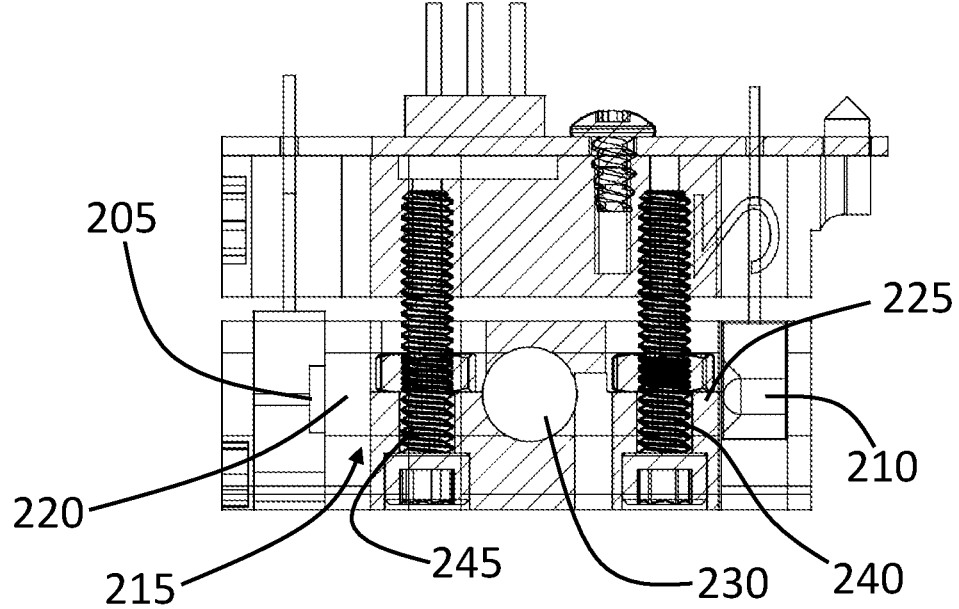
FIG. 2E is a front cross-sectional view of the medical instrument detector system of FIG. 2B taken along line A-A of FIG. 2D.

Referring now to the Figures, in which like reference numerals and names refer to structurally and/or functionally similar elements thereof, FIG. 1 shows a perspective view of an embodiment of a medical simulation system 100. The medical simulation unit 100 may include several subsystems, for example, a medical instrument detector system 200, a medical instrument tracker system 300, a braking system 400, and a device opening 105.

The medical simulation system 100 may be used to tactile or haptic feedback simulating tasks performed in the medical field. For example, the medical simulation system 100 may be designed to track and/or interact with one or more medical instruments and simulate the feel of a medical instrument entering and/or being manipulated within a patient. The medical simulation system 100 provides haptic feedback to a user so that the user may learn to use the selected medical instruments and/or determine a type of medical instrument to use in any number of potential medical situations.

For example, the medical simulation system 100 may be used to simulate the tactile feedback of a user inserting or manipulating a catheter within the vascular system of patient. Users of the medical simulation system 100 may learn how to use a catheter and/or how to select a particular catheter for a specific medical situation by using the medical simulation system 100. As noted above, the medical simulation system 100 includes various functional subsystems which are described in detail below.

The medical instrument detector system 200 is used to detect when one or more medical instruments are interacting with the medical simulation system 100. The medical instrument detector system 200 may also be used to detect a size and/or type of medical instrument that is interacting with the medical simulation system 100.

The medical instrument tracker system 300 of the medical simulation system 100 may be used to track the translation and rotation of a medical instrument as the medical instrument is moving within medical simulation system 100. The medical instrument tracker 300 may then provide the translational and rotational data of the medical instrument to the medical simulation system 100.

The braking system 400 may be used to simulate translational or rotational resistance or other haptic effects of the medical instrument entering or being manipulated within a patient. Thus, the braking system 400 acts on the selected medical instrument to simulate different resistances or other tactile feedbacks that may be experienced by user as if the selected medical instrument were being manipulated within an actual patient.

Medical instruments may enter and interact with the medical simulation system 100, medical instrument detector system 200, medical instrument tracker system 300, and/or braking system 400 through opening 105.

More specifically, FIGS. 2A, 2B, 2C, 2D, and 2E show a medical instrument detector system 200, in accordance with various embodiments. The detection system 200 may be used to determine when a medical instrument is interacting with medical simulation system 100. The medical instrument detection system 200 may comprise a light detecting element, for example detector diode 205, a light emitting element, for example light-emitting diode 210, and a light channel 215 having a first end 220 and a second end 225 extending between the detector diode 205 and emitting diode 210.

The light detector diode 205 may be adjustably coupled to a first end 220 of the light channel 215 and the light emitting diode 210 may be adjustably coupled to a second end 225 of the light channel 215. The light emitting diode 210 may be configured to transmit light through the light channel 215 toward the light detector diode 205.

The light detector diode 205 may be horizontally aligned with the light emitting diode 210. By aligning light detector 205 and light emitting diode 210 horizontally (and not vertically), it is less likely that debris will fall into the light detector 205 and/or light emitting diode 210 when a medical instrument interacts with the medical simulation system 100 and/or the medical instrument detection system 200.

The light channel 215 of the medical instrument detection system 200 may further comprise an opening (not shown) in a bottom wall of the light channel 215. The opening in the bottom wall of the light channel 215 may allow debris from a medical instrument to fall out of light channel 215 and prevent debris from building up within detection system 200.

Detection system 200 may further comprise an opening 230. Opening 230 may be located in a wall of light channel 215 between the first end 220 of light channel 215 and the second end 225 of the light channel 215. A medical instrument may pass through opening 230 transverse to a path of light transmitted from light emitting diode 210 toward light detecting diode 205. The light detector diode 205 may be configured to detect an amount of light and/or a change in an amount of light transmitted through the light channel 215. When a medical instrument passes through the light channel 215, it blocks at least some of the light transmitted from light emitting diode 210 toward light detecting diode 205. The light detecting diode 205 registers a change in light (based on the amount of light detected) when the medical instrument passes through light channel 215.

The light detecting diode 205 may be used to determine an amount of light transmitted and/or a change in an amount of light transmitted through the light channel 215 or the detector diode may provide data to a processor of the detection system 200 and/or medical simulation system 100. Any data transmitted from the detector diode 205 a processor associated with the detection system 200, simulation system 100, or elsewhere may be transmitted over at least one of a wired connection (e.g., a printed circuit board 235) or a wireless connection. The processor may then determine an amount of light transmitted and/or a change in an amount of light transmitted through the light channel 215.

Based on the amount of light detected and/or the change in the amount of light detected, the medical simulation system 100 and/or medical instrument detection system 200 may determine one or more dimensions of the instrument interacting with medical simulation system 100 and/or a type of medical instrument interacting with medical simulation system 100. The type of medical instrument may also be determined based on the determined dimension of the medical instrument. A type of medical instrument may correspond to a class of instrument such as a catheter, endoscope, syringe, tube, etc. or the type of medical instrument may correspond to a model or to the manufacturer of a particular medical instrument (e.g. a particular model of catheter provided from a particular manufacturer). Based on the determined dimension and/or type of medical instrument, the medical simulation system 100 may provide haptic feedback that is specifically tailored to a medical instrument of the determined size and type.

In a non-limiting example, the medical instrument that is interacting with medical simulation system 100 may be a catheter. The detection system 200 may register a change in the amount of light when the catheter interacts with the simulation system 100 and determine a dimension of catheter that is being used and a type of catheter that is being used. Based on the determined size and type of catheter, the medical simulation system 100 may implement haptic effects (e.g., a slip, a blockage, a stop within a vein, rotational resistance, translational resistance, etc. as described in more detail below) as would be encountered by a user of a catheter of the determined size and type on an actual patient. A user of the medical simulation system 100 may thus learn how to properly utilize a specific catheter through training featuring realistic haptic effects. Alternatively, an experienced practitioner can test different sizes and type of catheters in a realistic manner to determine personal preferences.

The light detecting diode 205 and the light emitting diode 210 may be adjusted independently of each other. In other words, light emitting diode 205 may be adjusted without affecting the position of the light emitting diode 210 and light emitting diode 210 may be adjusted without affecting the position of light detector diode 205. To achieve independent adjustment, light emitting diode 210 may be coupled to a first screw 240 and light detecting diode 205 may be coupled to a second screw 245. Adjustment of the first screw 240 allows a user to optimally position light emitting diode 210 at a first end 225 of light channel 215. Adjustment of the second screw 245 allows a user to optimally position light detecting diode 205 at a second end 220 of light channel 215. Light detecting diode 205 and light emitting diode 210 may be directly coupled to screws 245 and 240, respectively. By coupling the light emitting diode 210 to the first screw 240, the light emitting diode 210 may be adjusted independently of the light detecting diode 205 so that light is effectively transmitted through the light channel 215 from light emitting diode 210 light channel 215. Further, by coupling the light detecting diode 205 to the second screw 245, the light detecting diode 205 may be adjusted independently of the light emitting 210 so that light is effectively received through the light channel 215 by the light detecting diode 205.

Light detecting diode 205 and light emitting diode 210 may also be indirectly coupled to screws 245 and 240, respectively. The medical instrument detection system 200 may further comprise at least a first block 250 and a second block 255. The first block 250 may hold the printed circuit board 235. The second block 255 may contain the light channel 215. The first and second blocks may be coupled together by a first screw 240 and a second screw 245. The first screw 240 may be placed closer to the light emitting diode 210 and the second screw 245 may be placed closer to the light detecting diode 205. Turning the first screw 240 causes the first end 225 of the light channel 215 to move vertically (e.g., up or down) independently of the second end 220 of the light channel 215. Turning the second screw 245 causes the second end 220 of the light channel 215 to move vertically (e.g., up or down) independently of the first end 225 of the light channel 215. By having an adjustable light channel 215, the light channel 215 may be adjusted so that light is effectively received by light detector diode 205 and transmitted by light emitting diode 210 through the light channel 215.

Figure 3A:
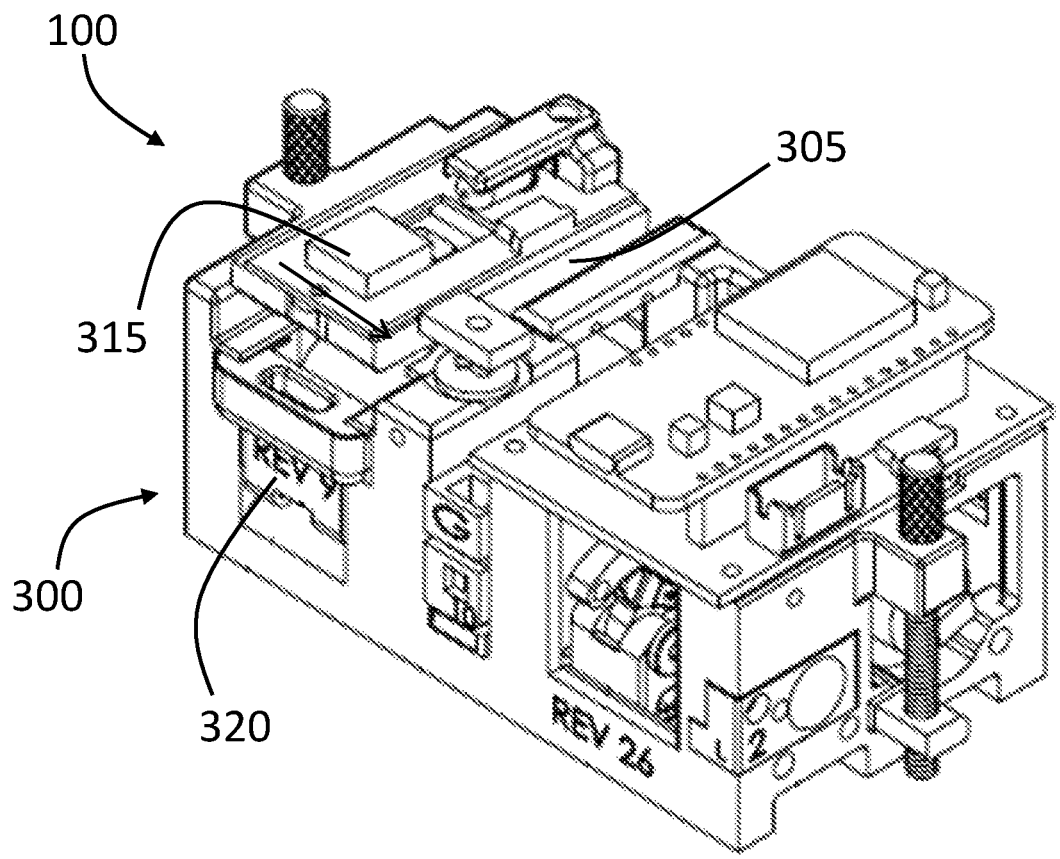
FIG. 3A is a perspective view of an embodiment of a medical instrument tracker system incorporated into a medical simulation system, in accordance with various embodiments disclosed herein.
Figure 4A:
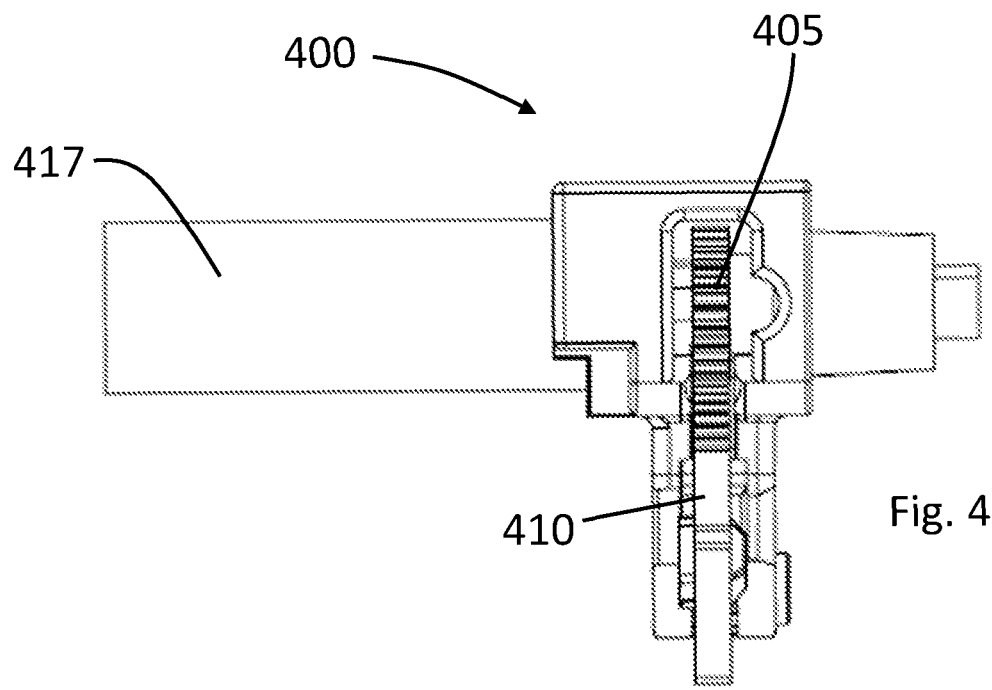
FIG. 4A is a plan view of an embodiment of a braking system, in accordance with various embodiments disclosed herein.
Figure 4B:
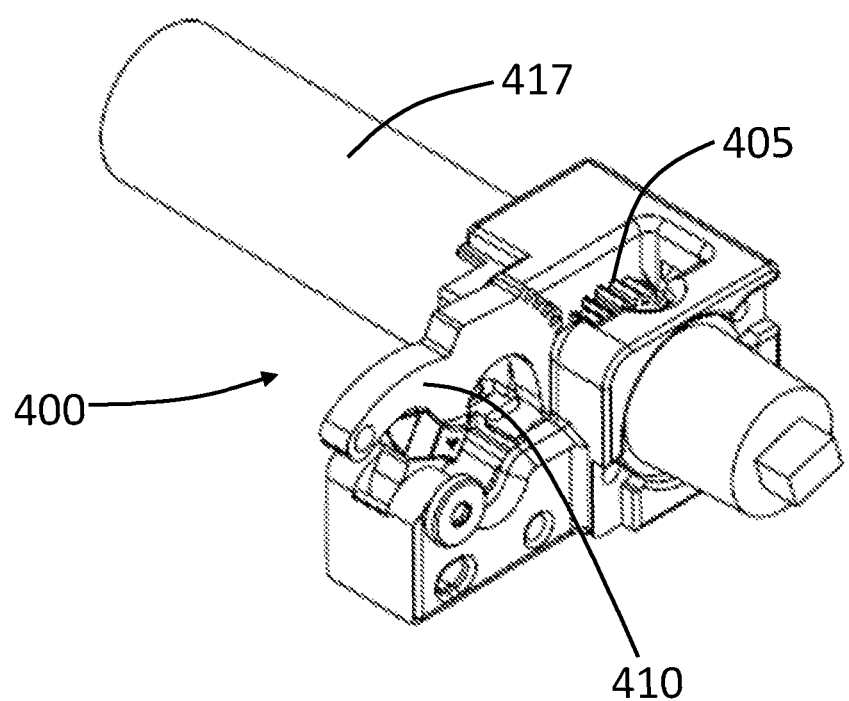
FIG. 4B is a front perspective view of the braking system of FIG. 4A.
Figure 4C:
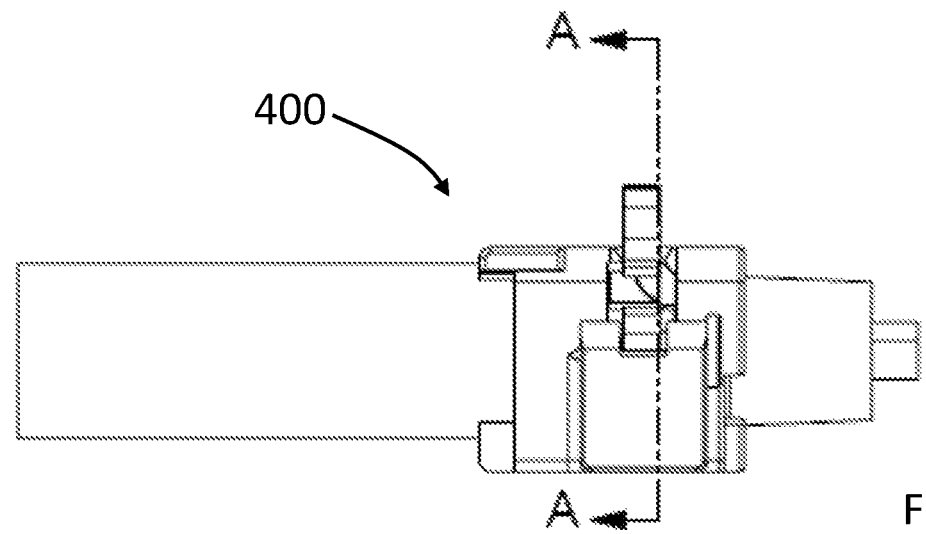
FIG. 4C is a front elevation view of the braking system of FIG. 4A.
Figure 4D:
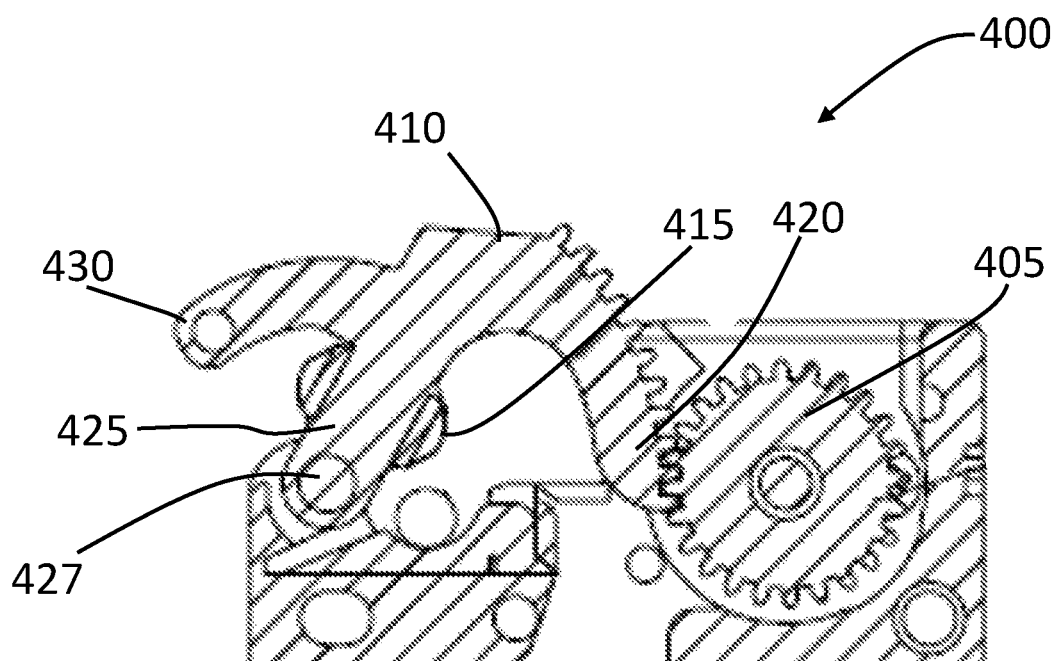
FIG. 4D is cross sectional view of the braking system of FIG. 4A taken along line A-A of FIG. 4C.

FIGS. 3A, 3B, and 3C shows an embodiment of a medical instrument tracker system 300 incorporated into a medical simulation system 100, in accordance with various embodiments. Medical instrument tracker system 300 may be used to track movement (i.e. translation and rotation) of a medical instrument that is interacting with medical simulation system 100. Tracker system 300 may comprise a housing 305, a ball 310, an optical sensor 315, and/or a door 320.

The housing 305 may contain the ball 310. The housing 305 may be configured such that the ball 305 is free to rotate in any direction within the housing 305, but the ball 305 is prevented from falling out of the housing 305. The housing 305 may have an opening at a top or bottom of the housing 305 such that at least part of the ball 310 protrudes from the opening. The opening 305 may be big enough to allow some of the ball 310 to protrude, but also small enough such that the ball 310 is prevented from falling out of the housing 305. An optical sensor 315 may be placed at above or below the opening to track the movement of the ball 310.

A medical instrument may interact with the ball 310 by travelling over or underneath the ball 310. The medical instrument interacts with the ball 310 at a side opposite to the opening. By placing the medical instrument underneath the ball 310, the housing 305 may allow for the ball 310 to move vertically so that the medical instrument passes underneath the ball 310 without adding additional friction. Additionally, by passing the medical instrument underneath the ball 310, the ball 310 may be lifted to engage with the opening so that an optical sensor 315 can track the movement of the ball 310.

As the medical instrument translates and/or rotates, the ball 310 will also move and rotate within the housing 305. An optical sensor 315 may be used to track the movement and/or rotation of the ball 305. The optical sensor 315 may be located above or below the opening of the housing 305.

The optical sensor 315 may be communicatively coupled to medical instrument tracker system 300 and/or medical simulation system 100 via a wired and/or wireless connection. The optical sensor 315 may send movement, position, orientation, and/or rotation data of the ball 310 to a processor of medical simulation system 100 and/or tracker system 300. The movement and/or rotation data of the ball 305 may then be translated into translational, positional, and/or rotational data that corresponds to the movement (e.g., translation, position, orientation, and/or rotation) of the medical instrument within the medical simulation system 100.

Based on the determined translation, position, orientation, and/or rotation of the medical instrument within medical simulation system 100, the medical simulation system may create haptic effects that are suitable for a medical instrument that is rotating and translating in a particular way.

The ball 310 of the tracker system 300 may be placed in the housing 305 from the side of housing 305 via a door 320 located in the side of the housing 305. The door 320 may then be closed preventing the ball 310 from being removed from the housing 305. The door 320 may held in place by at least one of friction, a clamp, snap or similar apparatus. The door 320 prevents the ball 310 from falling out of the housing 305 during transport. The door 320 also allows the housing 305 to be opened for maintaining the ball 310 and housing 305 without the need of additional tools. The door 320 pivots at the bottom (via a hinged connection) allowing the ball 310 to be removed for maintenance without requiring the simulation unit 100 to be removed from the medical simulation containment system 500 (shown in FIG. 5).

FIGS. 4A, 4B, 4C, and 4D show an embodiment of a braking system 400 incorporated into a medical simulation system 100, in accordance with various embodiments. The braking system 400 may be engage with a medical instrument and simulate haptic effects of a medical instrument entering a patient's body. The braking system 400 may comprise a drive gear 405, a curved braking arm 410, and a brake pad 415.

The drive gear 405 may be configured to engage with an electrical drive unit that drives the drive gear 405. An electric drive unit 417 in communication with the drive gear 405 may be communicatively coupled via a wired or wireless connection to a processor of the medical simulation system 100, a processor of the detection unit 200, and/or a processor of the tracker system 300. The electric drive unit 417 may operate at a particular speed to apply a particular amount of force to the medical instrument through brake arm 410 based on input from at least one of a processor of the medical simulation system 100, a processor of the detection unit 200, and/or a processor of the tracker system 300.

The drive gear 405 may further be configured to engage with curved braking arm 410. The drive gear 405 may cause the braking arm 410 to rotate and engage with a medical instrument that is interacting with medical simulation system 100.

The curved braking arm 410 may have a first end 420 and a second end 425. The first end 420 may be opposite to the second end 425. By having the first end 420 be opposite the second end 425, the fulcrum 427 of the curved braking arm 410 may be on the opposite side (i.e., the second end 425) from the side (i.e., the first end 420) where the force is applied.

The design of the curved brake arm 410 significantly increases the brake pressure range (from heavy to light) and improves the control of the brake arm. The increased range of forces allows the medical simulation system 100 to more realistically simulate the feel of a catheter or other medical instrument in a vein or another part of the body.

The first end 420 may be configured to engage with the drive gear 405. The first end 420 of the curved braking arm 410 may have gear teeth which are configured to engage with teeth of the drive gear 405. The second end 425 may have brake pad 415. The brake pad 415 may engage with a medical instrument that is interacting with medical simulation system 100. The medical instrument may travel underneath the brake pad 415. The brake pad 415 may apply friction to the medical instrument interacting with the medical simulation system 100 and simulate haptic effects. The second end 425 may further have a bar 430. The bar 430 may be placed along a path of the moving braking arm 410 to restrict the braking arm's rearward travel distance. The bar 430 may be removed to facilitate maintenance of the brake arm 410.

The information obtained from the detection unit 200 and the tracking system 300 may be used to determine what haptic effects to simulate using the braking system 400. Information that is obtained from detection unit 200 may comprise at least one of information about whether medical instrument is interacting with medical simulation system 100, information about a size of medical instrument that is interacting with medical simulation system 100, and/or information about a type of medical instrument that is interacting with medical simulation system 100. Information that is obtained from the tracker unit 300 may comprise at least one of translation, position, orientation, and/or rotation data corresponding to movement of the medical instrument within simulation system 100.

Based on the information received from the detection unit 200 and the tracking system 300, at least one of a processor of the medical simulation system 100, a processor of the detection unit 200, and/or a processor of the tracker system 300 may direct the braking system 400 to apply a particular amount of force to the medical instrument to simulate the feel of the medical instrument within the body of a patient.

For example, if the medical instrument is a catheter, a processor may receive information about at least one of a size of a catheter, a type of catheter, a position of the catheter, an orientation of the catheter, movement (i.e. rotation and translation) of a catheter, and/or the like. Based on the information received, a processor may determine haptic effects to simulate the feel of the catheter in a vein. These haptic effects may be relayed to braking system 400

(via a wired and/or wireless connection). The electric drive unit may then operate at particular speed to cause the braking system 400 to apply a particular amount of force to the catheter and to simulate haptic effects. For example, the braking system 400 may be used to implement haptic effects such as a slip, a blockage, or a stop within a vein that are typically encountered by a catheter associated with a particular set of information.

Figure 5:
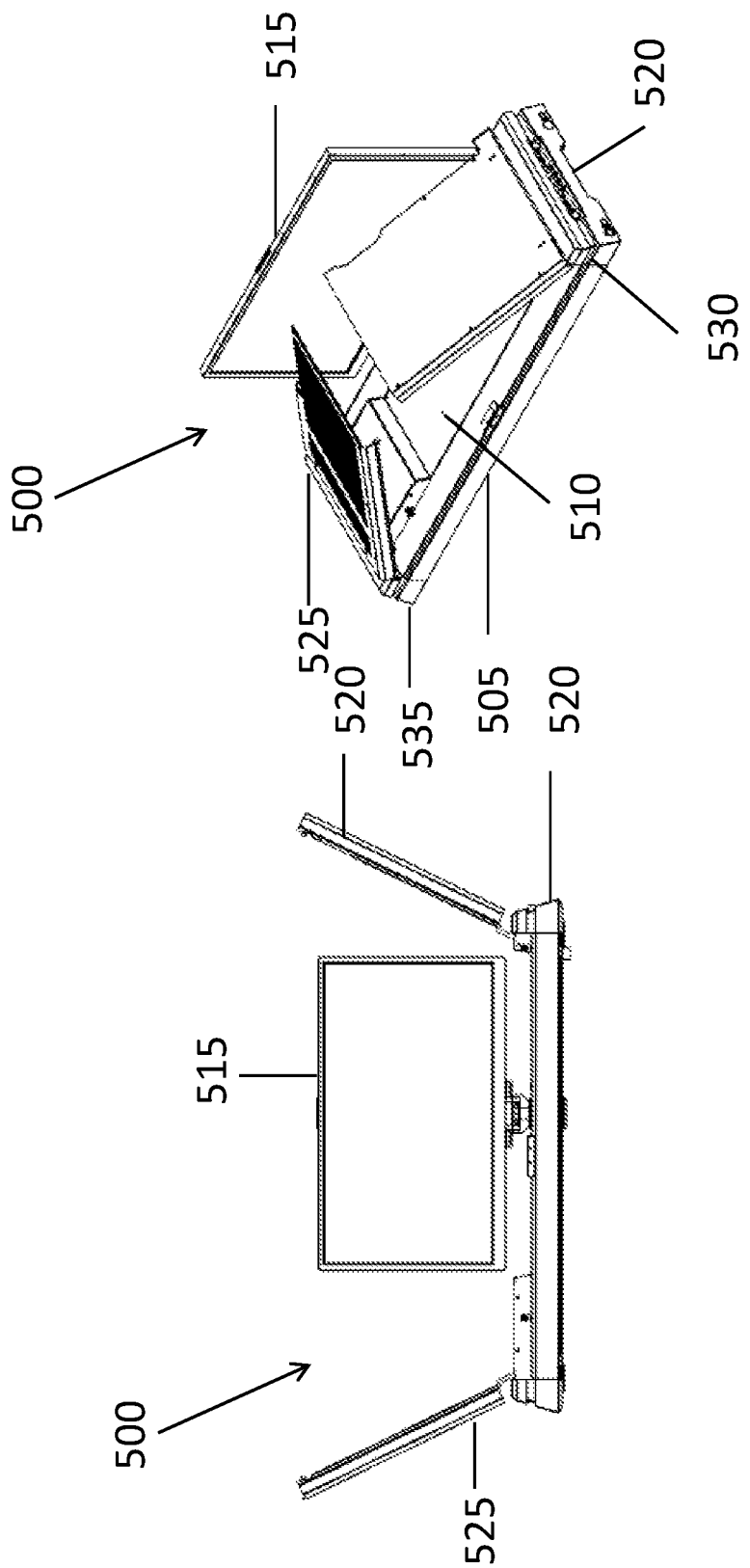
FIG. 5 is a front elevation and perspective view of an embodiment of a housing/medical simulation containment system as disclosed herein.

FIG. 5 shows an embodiment of a medical simulation containment system 500, in accordance with various embodiments. Medical simulation containment system 500 may be used to protect one or more medical simulation systems 100. Medical simulation containment system 500 may comprise a housing 505, a first chamber 510, a display device 515, first cover 520, and a second cover 525.

The display device 515 may be hingedly connected to the first chamber 515. The hinged connection may be configured to maintain the display device 515 in an upright position and rotate the display device 180 degrees. The display device may be communicatively coupled to a medical simulation unit 100 via a wired and/or wireless connection. The display device 515 may be used to display location information about where a medical instrument is within a person's body. A user may use the display device 515 to determine how to maneuver a medical instrument within medical simulation system 100.

The chamber 510 may have a first end 530 and a second end 535. The first cover 520 may be hingedly connected to the first chamber 510 of the housing 505 at the first end 530. The second cover 520 may be hingedly connected to the first chamber 510 of the housing 505 at the second end 535. The first cover 520 and the second cover 525 may fold over the display device 515 to maintain the display device 515 within the first chamber 510 of the housing 505 when the display device 515 is in a folded down position. The display device 515 may be prevented from rotating or moving when the first cover 520 and the second cover 525 are folded over the display device 515.

The housing 500 may further comprise a second chamber (not shown) that is positioned below the first chamber 510. The bottom surface of the first chamber 510 may be a top surface of the second chamber. The bottom surface of the first chamber may open to provide access to the second chamber. The second chamber may be accessible when the display device 515 is in an upright position. The second chamber of the housing 505 may contain one or more medical simulation units 100 (including detection system 200, tracking system 300, and braking system 400). The second chamber of the housing may further comprise one or more openings to allow a medical instrument to interact with one or more medical simulation systems 100 through housing 505.

Within the second chamber of the housing 505, two or more medical simulation systems 100 may be aligned in series and/or in parallel. When the medical simulation units 100 are aligned in series, a single medical instrument may interact with each simulation system 100 and it may simulate an insertion of an instrument into a long vein or another part of the body. When the medical simulation units are aligned in parallel, one or more medical instruments may interact with the simulation system 100 and it may simulate when two or more instruments need to be inserted into a vein or another part of the body. Data from the at least two medical simulation systems may be combined to show where a particular instrument is within a body and/or how the two or more medical instruments are interacting in a body relative to each other.

Figure 6:
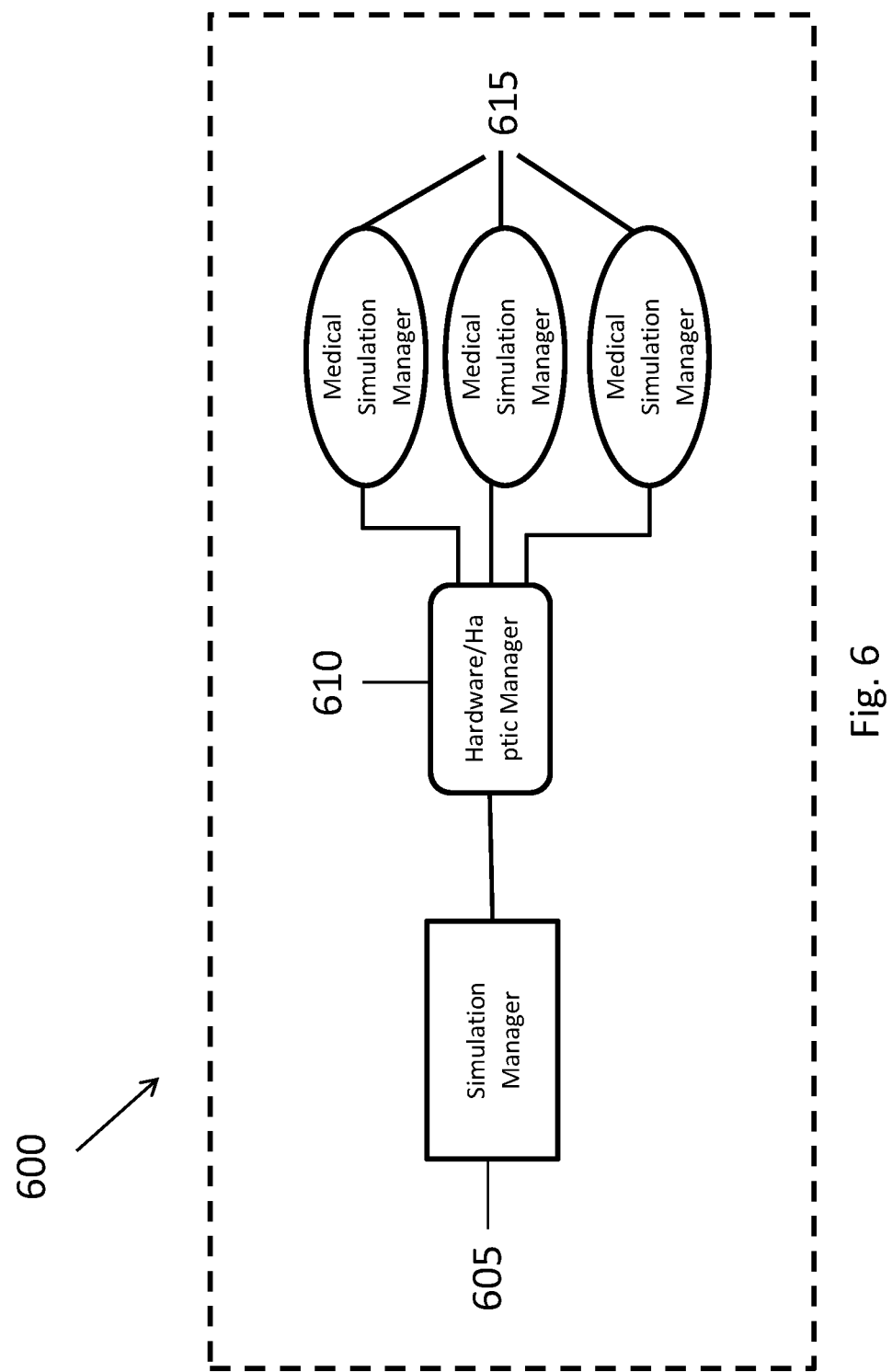
FIG. 6 is a block diagram illustrating a distributed processing system for use with a medical simulation system as disclosed herein.

The second chamber of the housing 505 may further comprise a simulation manager and a hardware manager (described with respect to FIG. 6).

FIG. 6 shows a block diagram of a distributed processing system 600, in accordance with various embodiments. The various components of the distributed processing system of FIG. 6 may be incorporated within a single housing that encloses the entirety of the distributed processing system 600; alternatively, the distributed processing system 600 might comprise a plurality of components divided between two or more discrete housings. Similarly, certain structural components of the distributed processing system 600 may be relatively more integrated and/or separated. Thus, distributed processing system 600 depicted by FIG. 6 should be considered a set of functional components, which may or may not correspond to individual structures. Moreover, while certain functional components of a distributed processing system 600 are illustrated by FIG. 6, the distributed processing system 600 might have one or more components of a general purpose computer system, as described below with respect to FIG. 8.

The distributed processing system 600 may be used to simulate haptic effects of inserting and/or moving a medical instrument within a body of a patient. Processing may be split into three core types (1) simulation manager 605, (2) hardware/haptic manager 610, and/or (3) medical simulation manager 615 (which may correspond to a processor located in medical simulation system 100). Although the processing is split between each of the three core types, each of the three core types may take on processing actions allocated to a different core type. For example, medical simulation system 615 may perform actions that are typically performed by simulation manager 605 and/or hardware manager 610.

The simulation manager 605 handles non-hardware simulation tasks, including physics, graphics, application logic, etc. It receives pre-processed data about the state of the system from the hardware manager 610 and, in turn, provides the hardware manager 610 with haptic rules and other tasks the hardware manager 610 should perform. Based on the data about the state of the system, simulation manager 605 may generate a graphical display (which may correspond to display device 515 shown in FIG. 5) that corresponds to the data obtained about the state of the system. The display may show a user where one ore more medical instruments are within a body and other information regarding the haptic effects the one or more medical device are experiencing in the medical simulation system. A user of the medical simulation system may then determine how to insert a medical instrument into a body and/or manipulate a medical instrument within a body based on the displayed information.

The hardware manager 610 may be associated with one or more medical simulation managers 615. The hardware manager acts as a bridge between simulation manager 605 and one or more medical simulation managers 615. The hardware manager 610 interprets digital and analog input coming from medical simulation managers 615. Some of this data is converted into data that can be understood by the simulation manager 605 and passed to simulation manager 605. Data from one or more medical simulation manager 615 can be combined into simpler values. For example, medical instrument translation and rotation can be tracked along several medical simulation systems that are aligned in series, but the translation and rotation may be translated into a single length and rotation value for each medical instrument interacting with the medical simulation system for the simulation manger 605. The simulation manager is not required to know how many medical simulation systems are in use or what type of medical simulation system (e.g., a medical system unit to simulate a catheter or other medical instrument) is in use.

The hardware manager 610 receives instructions from the simulation processor 605 and determines how best to use the existing medical simulation managers 615 to implement the requests through a medical simulation system. This includes haptic effects for medical instruments which are defined in a general way by the simulation manager 605, but converted into specific braking actions on in medical simulation systems to get the desired haptic effects.

Additional hardware managers 610 and their associated medical simulation managers 615 may be added without changes to the medical simulation's hardware design. For example, two or more additional medical simulation units may be aligned in parallel to simulate two or more entry points in the body.

Medical simulation managers 615 are input/output modules that encapsulate a set of hardware features. These features can include the reading and writing of analog and digital values to associated parameters (detection unit parameters, tracker unit parameter, brake unit parameters, etc). Medical simulations managers 615 may run on real-time processors that can contain logic necessary to implement high-speed controls logic. For example, the logic to perform certain haptic tasks is run at the level of the medical simulation manger 615 to allow for fine motor controls and for a user of the medical simulation system to experience haptic feedback in real-time.

Medical simulation managers 615 can be identified by their type, version, and serial id to allow the hardware manager 610 to determine the correct way to communicate, interpret, and use the data coming from one or more associated medical simulation managers 615.

Medical simulation managers 615 and their associated medical simulation system (which may correspond to medical simulation system 100) may be used as part of the distributed processing system 600, but also can be independent input/output modules to be integrated in other systems. For example, one or more medical simulation systems can be used wirelessly to provide simple medical instrument tracking capabilities running simulations on at least one of a tablet or a smartphone.

Figure 7:
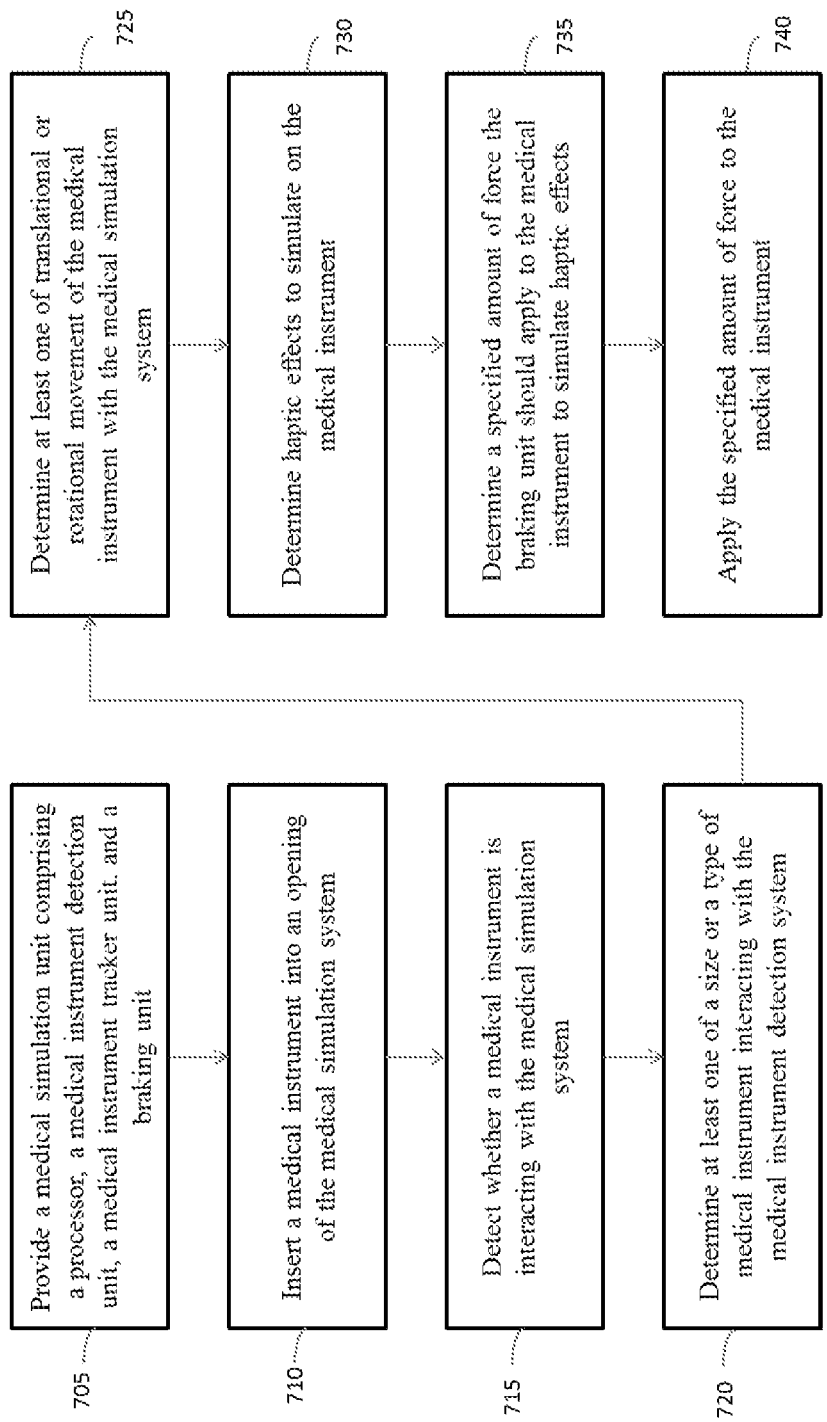
FIG. 7 is a flow diagram illustrating a method for using a medical simulation system as disclosed herein.

With regard to FIG. 7, FIG. 7 is a flow diagram illustrating a method 700 for using a medical simulation system, in accordance with various embodiments.

While the techniques and procedures are depicted and/or described in a certain order for purposes of illustration, it should be appreciated that certain procedures may be reordered and/or omitted within the scope of various embodiments. Moreover, while the method 700 illustrated by FIG. 7 can be implemented by or with (and, in some cases, are described below with respect to) the systems 100, 200, 300, 400, 500, and 600 of FIGS. 1, 2, 3, 4, 5, and 6 respectively (or components thereof), such methods may also be implemented using any suitable hardware (or software) implementation. Similarly, while each of the systems 100, 200, 300, 400, 500, and 600 of FIGS. 1, 2, 3, 4, 5, and 6 respectively (or components thereof), can operate according to the method 700 illustrated by FIG. 7 (e.g., by executing instructions embodied on a computer readable medium), the systems 100, 200, 300, 400, 500, and 600 of FIGS. 1, 2, 3, 4, 5, and 6 respectively, can each also operate according to other modes of operation and/or perform other suitable procedures.

In FIG. 7, method 700 may comprise providing a medical simulation system (which may correspond to medical simulation system 100 or medical simulation system associated with medical simulation manager 615) comprising a processor, a medical instrument detection unit, a medical instrument tracker unit, and a braking unit (block 705). The method may further comprise inserting a medical instrument into an opening of the medical simulation system (block 710).

Next, the method 700 may detect, with the detection unit, whether a medical instrument is interacting with the medical simulation system (block 715) and determine, with the detection unit, at least one of a size or a type of medical instrument interacting with the medical instrument detection system (block 720). The medical instrument tracker unit may determine at least one of translational or rotational movement of the medical instrument with the medical simulation system (block 725).

Based on at least one of the detection of a medical instrument, the determination of the size or the type of medical instrument, or the determination of the translational or rotational movement of the medical instrument, the method 700 may determine, with a processor of the medical simulation system, haptic effects to simulate on the medical instrument (block 730). Based on the determined haptic effects, the method 700 may comprise determining, with the processor, a specified amount of force the braking unit should apply to the medical instrument to simulate the haptic effects (block 735). The braking unit may then apply the specified amount of force to the medical instrument to simulate the haptic effect (block 740).

Exemplary System and Hardware Implementation

Figure 8:
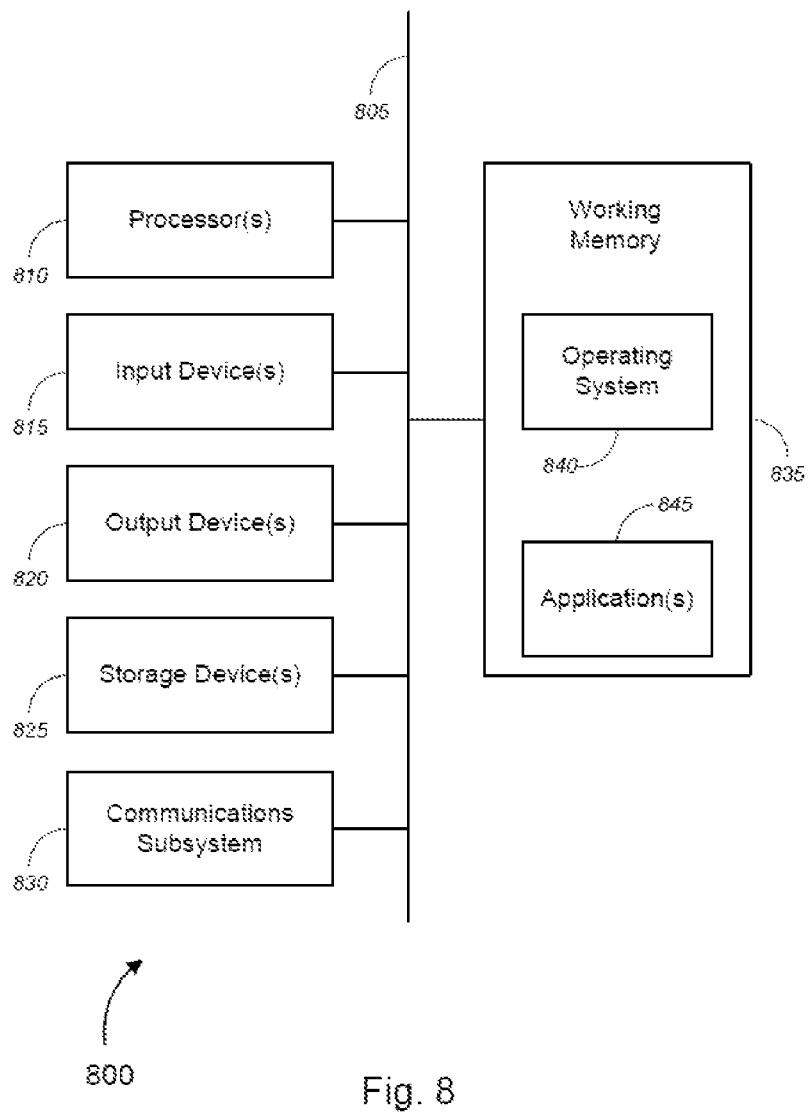
FIG. 8 is a block diagram illustrating an exemplary computer or system hardware architecture, in accordance with various embodiments disclosed herein.

FIG. 8 is a block diagram illustrating an exemplary computer or system hardware architecture, in accordance with various embodiments. FIG. 8 provides a schematic illustration of one embodiment of a computer system 800 that can perform the methods provided by various other embodiments, as described herein, and/or can perform the functions of computer or hardware system (i.e., medical simulation system 100, medical instrument detection system 200, medical instrument tracker system 300, braking system 400, simulation manger 505, Hardware manager 510, etc.), as described above. It should be noted that FIG. 8 is meant only to provide a generalized illustration of various components, of which one or more (or none) of each may be utilized as appropriate. FIG. 8, therefore, broadly illustrates how individual system elements may be implemented in a relatively separated or relatively more integrated manner.

The computer or hardware system 800—which might represent an embodiment of the computer or hardware system (i.e., medical simulation system 100, medical instrument detection system 200, medical instrument tracker system 300, braking system 400, simulation manger 505, hardware manager 510, medical simulation manager 515, etc.), described above with respect to FIGS. 1-6—is shown comprising hardware elements that can be electrically coupled via a bus 805 (or may otherwise be in communication, as appropriate). The hardware elements may include one or more processors 810, including, without limitation, one or more general-purpose processors and/or one or more special-purpose processors (such as microprocessors, digital signal processing chips, graphics acceleration processors, and/or the like); one or more input devices 815, which can include, without limitation, a mouse, a keyboard, a medical instrument detection system, a medical instrument tracker system, a braking system, a simulation manger, a hardware manager, a medical simulation manager, and/or the like; and one or more output devices 820, which can include, without limitation, a display device, a brake system, a simulation manger, a hardware manager, a medical simulation manager, a printer, and/or the like.

The computer or hardware system 800 may further include (and/or be in communication with) one or more storage devices 825, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable, and/or the like. Such storage devices may be configured to implement any appropriate data stores, including, without limitation, various file systems, database structures, and/or the like.

The computer or hardware system 800 might also include a communications subsystem 830, which can include, without limitation, a modem, a network card (wireless or wired), an infra-red communication device, a wireless communication device and/or chipset (such as a Bluetooth™ device, an 802.11 device, a Wi-Fi device, a WiMAX device, a WWAN device, a Z-Wave device, a ZigBee device, cellular communication facilities, etc.), and/or the like. The communications subsystem 830 may permit data to be exchanged with a network (such as the network described below, to name one example), with other computer or hardware systems, and/or with any other devices described herein. In many embodiments, the computer or hardware system 800 will further comprise a working memory 835, which can include a RAM or ROM device, as described above.

The computer or hardware system 800 also may comprise software elements, shown as being currently located within the working memory 835, including an operating system 840, device drivers, executable libraries, and/or other code, such as one or more application programs 845, which may comprise computer programs provided by various embodiments (including, without limitation, hypervisors, VMs, and the like), and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be encoded and/or stored on a non-transitory computer readable storage medium, such as the storage device(s) 825 described above. In some cases, the storage medium might be incorporated within a computer system, such as the system 800. In other embodiments, the storage medium might be separate from a computer system (i.e., a removable medium, such as a compact disc, etc.), and/or provided in an installation package, such that the storage medium can be used to program, configure, and/or adapt a general purpose computer with the instructions/code stored thereon. These instructions might take the form of executable code, which is executable by the computer or hardware system 800 and/or might take the form of source and/or installable code, which, upon compilation and/or installation on the computer or hardware system 800 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware (such as programmable logic controllers, field-programmable gate arrays, application-specific integrated circuits, and/or the like) might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer or hardware system (such as the computer or hardware system 800) to perform methods in accordance with various embodiments of the invention. According to a set of embodiments, some or all of the procedures of such methods are performed by the computer or hardware system 800 in response to processor 810 executing one or more sequences of one or more instructions (which might be incorporated into the operating system 840 and/or other code, such as an application program 845) contained in the working memory 835. Such instructions may be read into the working memory 835 from another computer readable medium, such as one or more of the storage devices 825. Merely by way of example, execution of the sequences of instructions contained in the working memory 835 might cause the processor(s) 810 to perform one or more procedures of the methods described herein.

The terms "machine readable medium" and "computer readable medium," as used herein, refer to any medium that participates in providing data that causes a machine to operate in a specific fashion. In an embodiment implemented using the computer or hardware system 800, various computer readable media might be involved in providing instructions/code to processor(s) 810 for execution and/or might be used to store and/or carry such instructions/code (e.g., as signals). In many implementations, a computer readable medium is a non-transitory, physical, and/or tangible storage medium. In some embodiments, a computer readable medium may take many forms, including, but not limited to, non-volatile media, volatile media, or the like. Non-volatile media includes, for example, optical and/or magnetic disks, such as the storage device(s) 825. Volatile media includes, without limitation, dynamic memory, such as the working memory 835. In some alternative embodiments, a computer readable medium may take the form of transmission media, which includes, without limitation, coaxial cables, copper wire and fiber optics, including the wires that comprise the bus 805, as well as the various components of the communication subsystem 830 (and/or the media by which the communications subsystem 830 provides communication with other devices). In an alternative set of embodiments, transmission media can also take the form of waves (including, without limitation, radio, acoustic, and/or light waves, such as those generated during radio-wave and infra-red data communications).

Common forms of physical and/or tangible computer readable media include, for example, a floppy disk, a flexible disk, a hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read instructions and/or code.

Various forms of computer readable media may be involved in carrying one or more sequences of one or more instructions to the processor(s) 810 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer or hardware system 800. These signals, which might be in the form of electromagnetic signals, acoustic signals, optical signals, and/or the like, are all examples of carrier waves on which instructions can be encoded, in accordance with various embodiments of the invention.

The communications subsystem 830 (and/or components thereof) generally will receive the signals, and the bus 805 then might carry the signals (and/or the data, instructions, etc. carried by the signals) to the working memory 835, from which the processor(s) 805 retrieves and executes the instructions. The instructions received by the working memory 835 may optionally be stored on a storage device 825 either before or after execution by the processor(s) 810.

While certain features and aspects have been described with respect to exemplary embodiments, one skilled in the art will recognize that numerous modifications are possible. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture but instead can be implemented on any suitable hardware, firmware and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with—or without—certain features for ease of description and to illustrate exemplary aspects of those embodiments, the various components and/or features described herein with respect to a particular embodiment can be substituted, added and/or subtracted from among other described embodiments, unless the context dictates otherwise. Consequently, although several exemplary embodiments are described above, it will be appreciated that the invention is intended to cover all modifications and equivalents within the scope of the following claims.

What is claimed is:

1. A medical simulation system comprising:
    a braking unit for applying friction to a medical instrument, wherein the braking unit comprises:
        an electrical drive unit;
        a drive gear arranged for cooperation with the electrical drive unit;
        a curved braking arm having a first end and a second end which is opposite to the first end, wherein the first end of the braking arm is arranged for cooperation with the drive gear, and wherein a fulcrum of the braking arm is located on the second end of the braking arm opposite to the first end of the braking arm and drive wheel; and
        a brake pad attached to the braking arm which engages the medical instrument.

2. The medical simulation system of claim 1, wherein the medical instrument is a catheter.

3. The medical simulation system of claim 2, wherein, when the brake pad engages the catheter, friction is applied to the catheter simulating at least one of the insertion of the catheter into a vein, a slip of the catheter in the vein, or a stop of the catheter in the vein.

4. The medical simulation system of claim 1, wherein the braking unit further comprises:
    a bar removably coupled to the second end of the braking arm, wherein the bar restricts the braking arm from travelling backwards.

* * * * *